United States Patent
Hotchkiss et al.

(10) Patent No.: US 8,107,208 B2
(45) Date of Patent: Jan. 31, 2012

(54) INSULATED SURGE SUPPRESSION CIRCUIT

(75) Inventors: Ronald Hotchkiss, Brooksville, FL (US); Richard Hotchkiss, Jr., Brooksville, FL (US); Ricky Fussell, Webster, FL (US); Andrea Haa, Brooksville, FL (US)

(73) Assignee: Surge Suppression Incorporated, Destin, FL (US)

( * ) Notice: Subject to any disclaimer, the term of this patent is extended or adjusted under 35 U.S.C. 154(b) by 714 days.

(21) Appl. No.: 12/195,556

(22) Filed: Aug. 21, 2008

(65) Prior Publication Data

US 2008/0304200 A1   Dec. 11, 2008

Related U.S. Application Data

(63) Continuation-in-part of application No. 11/003,828, filed on Dec. 3, 2004, now Pat. No. 7,417,841, and a continuation-in-part of application No. 12/188,476, filed on Aug. 8, 2008.

(51) Int. Cl.
*H02H 9/04* (2006.01)
(52) U.S. Cl. ........ 361/118; 361/736; 361/730; 361/674; 361/601; 174/50; 174/520; 174/521; 174/50.5; 174/552; 257/683; 257/729; 257/790; 257/687; 257/788; 29/830; 29/825; 29/841; 29/848
(58) Field of Classification Search .................. 257/683, 257/729, 790, 687, 788; 361/736, 730, 674, 361/601; 250/559.45, 222.2; 340/556; 174/50, 174/520, 521, 50.5, 552; 29/830, 825, 841, 29/848
See application file for complete search history.

(56) References Cited

U.S. PATENT DOCUMENTS

| 3,135,349 | A | * | 6/1964 | Lahti | 381/341 |
|---|---|---|---|---|---|
| 3,219,884 | A | * | 11/1965 | Chessin et al. | 361/674 |
| 3,592,290 | A | * | 7/1971 | Armstrong | 181/151 |
| 3,909,504 | A | * | 9/1975 | Browne | 174/524 |
| 4,057,689 | A | * | 11/1977 | Stallings, Jr. | 381/335 |
| 4,101,736 | A | * | 7/1978 | Czerwinski | 381/332 |
| 4,128,738 | A | * | 12/1978 | Gallery | 381/335 |
| 4,356,882 | A | * | 11/1982 | Allen | 181/151 |
| 4,485,275 | A | * | 11/1984 | Lahti | 381/341 |
| 4,795,380 | A |  | 1/1989 | Frantz |  |
| 4,962,363 | A |  | 10/1990 | Sexton, Jr. |  |
| 5,124,876 | A |  | 6/1992 | Misencik et al. |  |
| 5,488,534 | A | * | 1/1996 | Rau et al. | 361/56 |

(Continued)

FOREIGN PATENT DOCUMENTS

EP    1000429 B1    9/2004

(Continued)

*Primary Examiner* — Dameon Levi
*Assistant Examiner* — Theron Milliser
(74) *Attorney, Agent, or Firm* — Jamse E. Larson

(57) ABSTRACT

A potted electrical circuit is enclosed within a housing and has a first and second fiberglass layer that is laid upon a top surface of the potted electrical circuit. A lid of the housing seals the electrical circuit there within and an opening formed in a side wall allows circuitry wiring to extend there from out. The first fiberglass layer is a woven layer while the second fiberglass layer is a padding-like layer. Circuitry wiring pushes through the woven first fiberglass layer before extending out through the opening in the housing. The first fiberglass layer is tucked in and around the electrical circuit and adheres to the inside of the housing by attaching to the potting material while it hardens. In a preferred embodiment, the electrical circuit in combination with the insulation material is used within a transient voltage surge suppression device.

12 Claims, 12 Drawing Sheets

U.S. PATENT DOCUMENTS

| | | | |
|---|---|---|---|
| 5,617,297 A * | 4/1997 | Lo et al. | 361/737 |
| 5,698,846 A * | 12/1997 | Funke | 250/222.2 |
| 5,781,394 A | 7/1998 | Lorenz et al. | |
| 5,905,622 A * | 5/1999 | Finlay et al. | 361/118 |
| 5,977,621 A * | 11/1999 | Stuck | 257/683 |
| 6,073,723 A * | 6/2000 | Gallo | 181/151 |
| 6,184,464 B1 * | 2/2001 | Liptak et al. | 174/521 |
| 6,430,017 B1 | 8/2002 | Finlay, Sr. et al. | |
| 6,433,987 B1 * | 8/2002 | Liptak | 361/118 |
| 6,740,814 B2 * | 5/2004 | Ohta et al. | 174/68.1 |
| 7,130,198 B2 * | 10/2006 | Tanaka | 361/730 |
| 7,146,721 B2 * | 12/2006 | Hunkeler et al. | 29/841 |
| 7,417,841 B2 * | 8/2008 | Hotchkiss et al. | 361/103 |
| 7,467,464 B2 * | 12/2008 | Osawa et al. | 29/841 |
| 7,897,234 B2 * | 3/2011 | Selverian et al. | 428/76 |
| 2004/0196636 A1 * | 10/2004 | Kim | 361/736 |
| 2007/0012481 A1 * | 1/2007 | Prager | 174/520 |
| 2007/0014092 A1 * | 1/2007 | Tanaka | 361/730 |
| 2008/0304200 A1 * | 12/2008 | Hotchkiss et al. | 361/111 |
| 2009/0040735 A1 * | 2/2009 | Chan et al. | 361/748 |
| 2010/0025101 A1 * | 2/2010 | Steffler | 174/527 |
| 2010/0033885 A1 * | 2/2010 | Hotchkiss et al. | 361/56 |
| 2010/0193238 A1 * | 8/2010 | Duffy | 174/520 |
| 2011/0085316 A1 * | 4/2011 | Myers et al. | 361/818 |

FOREIGN PATENT DOCUMENTS

| | | |
|---|---|---|
| EP | 1806818 A2 | 4/2007 |

* cited by examiner

INSULATED SURGE SUPPRESSION CIRCUIT

PRIOR APPLICATIONS

This application is a Continuation-in-part of Ser. No. 11/003,828, filed on Dec. 3, 2004, now allowed, and Ser. No. 12/188,476, filed on Aug. 8, 2008, now pending.

BACKGROUND OF THE INVENTION

1. Field of the Invention

The present invention relates to an apparatus for protecting electrical circuits from the effects of component product residue due to circuit failure. More particularly, it relates to an apparatus for protecting potted electrical circuits enclosed within housings that may typically employ surge suppression or other like circuitry used in the mitigation of electrical anomalies and abnormal conditions in devices to which the surge suppression circuitry is connected from component product residue that may be subjected upon surrounding circuitry when a failure of any particular circuit occurs.

2. Description of the Prior Art

Component failure on circuit boards of all types is very well known in the prior art. Some component failure can have little or no effects on the circuit itself and/or the surrounding circuitry. However, in other circuitry, component failure can have devastating effects on the specific circuit board containing the failed component or on a surrounding circuit board, circuit panel or other electrical equipment in close proximity thereto.

Circuitry that is specifically designed to fail in certain circumstances can be found in Transient Voltage Surge Suppression (TVSS) devices, also known as Surge Protective Devices (SPD). These devices are well known in the prior art. TVSS devices are used with computers, other types of electrical equipment and electrical circuits to protect against electrical line voltage surges and other occurring transient electrical anomalies that may occur along an electrical power line to which the equipment or circuit is coupled. Transient over voltages or voltage surges result in peak voltage levels that occur within an electrical line that are higher than that which the equipment being protected is rated to handle (i.e., over-voltages). Transient electrical anomalies include other types of electrical occurrences in the electrical line that are considered sub-cycle events which cause the equipment to operate improperly or completely fail (i.e., over-currents and the like). Transient over voltages or voltage surges have become even more problematic in today's sophisticated electrical world wherein sensitive computerized equipment requires a constant and regulated supply voltage.

Various types of voltage surges that can affect an electrical device or circuit can occur at any given time within an electrical line, and include Temporary Over Voltages, and abnormal conditions such as Full-Phase Over voltages and Limited Current Over voltages. It is desirable to suppress any excess voltage or current that occurs on an electrical circuit that has been disturbed. Studies by the Institute of Electrical and Electronics Engineers (IEEE) have shown 120 Volt power lines reaching as high as 5,600 Volts. Suppression of these over-voltages and other transient electrical anomalies is highly desirable, and many instances critical, to the operation of an electrical device, computer or electrical circuit.

Transient over voltages and voltage surges can occur due to a plurality of factors, to include, but are not limited to, internal anomalies and external anomalies such as, lightning strikes, circuit overloads, power company grid activity, temporary or permanent failure of the neutral conductor, recovery from brown-outs, black-outs and circuit interruption by simple human error. Since transient over voltages and voltage surges are very common, but difficult to predict, it is imperative to have a TVSS device on line at all times protecting the targeted piece of electrical equipment or circuit. To leave the equipment unprotected can result in a devastating consequence wherein the equipment is temporarily brought off-line, severely damaged or completely destroyed. This result could be detrimental to hospitals, police, fire and rescue units, the military and other critical functioning entities who can not afford to be "off-line" for any period of time. It is therefore critical to suppress these surges and anomalies and minimize their effect on the electrical equipment they are charged to protect.

It is understandable however, that even the best, most complex, most redundant TVSS devices are not one hundred percent effective against all electrical line surges and transient anomalies. However, suppressing as many of these surges and transients as possible most likely will result in a longer life for the electrical equipment that the TVSS device is protecting. It will also help to minimize any possible "down-time."

Many TVSS devices, and in particular solid state devices, employ metal oxide varistors (MOVs) to provide for a non-linear voltage-current relationship for handling the surge suppression. However, other TVSS devices exist, which employ silicon avalanche diodes (SADs), zener diodes, selenium cells and high voltage capacitors for surge suppression. In other TVSS devices, gas discharge tubes are employed for the surge suppression component. MOV designed TVSS devices are favored over many other surge suppression components due to their ability to be used in low voltage applications, such as, for example, AC power distribution systems having a normal and nominal operating voltage less than or about 600 volts AC (600 VAC).

MOVs act as a type of current diverter for the TVSS device. Under normal conditions, TVSS device surge suppression components, such as MOVs, draw very little current. As the voltage level increases across the TVSS device, to a level higher than the system voltage and that which the equipment it is protecting is designed (rated) to handle, the impedance of the TVSS circuit drops significantly, effectively causing electrical conduction across the surge suppression components or MOVs. Since very low impedance is required in voltage surge suppression, this result is highly desirable. The result of this current diverting scheme is voltage surge absorption by the MOVs. The energy absorbed by the surge suppression components, such as the MOVs, is dissipated as heat. In some instances (a sustained over voltage condition), the heat rises to a level which causes the MOV, or other surge suppression component, to burn, melt or explode. Although the desired result of voltage surge suppression may have been realized, the melting, burning or explosion of the MOV can cause other problems that must be addressed. For instance, the MOV can vaporize, which can result in plasma being formed, which in turn creates a new electrical conductor. This new electrical conduction defeats the purpose of the TVSS device resulting in damage to the equipment that the TVSS device is meant to protect by letting through the voltage surge or transient which the TVSS was intended to suppress. Further, unacceptable end of life conditions can cause damage to the equipment that the TVSS was intended to protect as well as surrounding equipment near the installation site of the TVSS. For these reasons, it is imperative to provide a mechanism for the TVSS device which would permit it to operate up to a level which provides for adequate transient voltage surge suppression all the while providing for the ability to be brought off line to avoid TVSS device failure or environmental hazards in cases where the surge protective device components are reaching their end of life. In other words, it is desirable to provide a manner in which the TVSS device, or other like devices, can safely fail, otherwise known as "acceptable failure modes" or "acceptable end-of-life conditions." And in those situations wherein acceptable failure modes or acceptable end-of-life conditions results in component product residue being projected and thereby subjected on surrounding circuitry, it is desirable to contain such residue and minimize or eliminate damage to the surrounding circuitry.

To avoid the problems associated with surge suppression component (i.e., MOV) destruction, which can cause TVSS device failure, advancements have been made to TVSS devices, including but not limited to, device container improvements to quell or contain plasma formation and the provision of fusing circuitry to prohibit MOV burn-up. U.S. Pat. No. 5,488,534 to Rau et al. addresses both of these issues. To inhibit plasma formation, a plastic cover and housing are used for the TVSS module, silver wires serve as fuses or fuse links since they are known to have a lower oxidation energy level than copper or aluminum, and longer lengths are used for the fuse wires which raises voltage re-strike levels thereby reducing arc formation that may occur in a wire melt down situation. In this prior art device, one wire fuse is used for every MOV that is employed. Although this may be appropriate when employing small thermal fuses for each MOV, this would be more difficult if using larger current rated fuses. If so, the use of one current rated fuse for every MOV would require that a larger housing be employed. For those circuits that require a significant level of transient voltage surge suppression, the size of such a device would not be acceptable for most applications with today's modern need for limited space requirements. Further, even if the TVSS device could be made to be compact due to a minimal amount of surge suppression components being employed, and therefore a minimal number of fuses being employed, space requirements within the environment where the device is employed could still dictate that the device of this prior art reference is too large (i.e., the confined spacing requirements of a naval vessel). Still further, the use of a current rated fuse for every MOV would most likely cause the TVSS device to constantly go "off-line" due to the fast acting response time of standard current rated fuses. This of course would defeat the entire purpose of the TVSS device. On the other hand, if only thermal fuses are employed, then the problems associated with a non-performing TVSS device that has reached its end of life due to high current abnormal over voltage conditions, will still exist since the thermal fuses only work at the component level to take over-heated MOV components off-line. Simply put, the use of thermal fuses only at the component level is inadequate for today's needs in transient voltage surge suppression technology. Another aspect of this prior art reference, as to the issue of containment of component product reside, relates to the use of a sand and epoxy fill material, which is used to fill spaces and voids to prevent the spread of any plasma created due to component failure or fuse wire clearing. However, the use of such fill material is very limiting in that once it is applied to the circuit it can not be removed to change simple device repairs.

Other attempted advancements in the prior art of improved safety for surge suppression circuits can be seen in European Patent Application No. 07250027.5 (Publication No. EP 1 806 818 A2), wherein thermal cutoffs are employed and revised layouts or orientations of the components are chosen to reduce the risk of burning through the outer enclosure in the event that electrical components, such as MOVs, over heat. However, revised layouts and/or orientation of components can limit what can be placed on a specific circuit board and is not an ideal way to solve the problem of component product residue containment.

Other attempted advancements in the prior art, such as U.S. Pat. No. 6,184,464 to Liptak et al., have placed restrictive and/or resilient materials around a circuit board before it is potted with a material, which is poured over the circuit board and the restrictive and/or resilient material and then allowed to hardened. Although this has provided an added protective layer, it again is limiting in that no modifications to the device, circuit board or material layers can be made once it is encapsulated within the potting material.

In view of all of the above, improvements are clearly needed in the art of protecting circuit boards and devices in general, which employ circuitry that is known to, or designed to purposefully overheat or fail upon certain events occurring, like those most often seen in surge suppression and like devices.

SUMMARY OF THE INVENTION

We have invented a novel insulation system for use with electrical circuits, which overcomes the deficiencies seen in the prior art. Although our novel insulation system can be used with a wide variety of electrical circuits it is best employed with electrical circuits that are enclosed within a housing. Further, while best used with enclosed electrical circuits, the novel insulation system of the present invention is best used with surge suppression circuitry used in devices such as TVVS devices. However, nothing herein limits the use of our novel insulation system with only enclosed surge suppression circuits.

Our novel insulation system employs a housing for receiving an electrical circuit, such as, by way of example, a surge suppression circuit. The size and shape of the housing is dependent on the size and/or orientation of the circuit board or boards employed. Each circuit is potted with a potting material that is be poured wet over the circuit board and allowed to harden. While in a preferred embodiment, the housing has at least one opening for allowing wires associated with the potted circuit to protrude through the housing, wires may remain internal for connection to terminal strips and therefore not protrude through the housing at least opening.

The novel insulation system of the present invention also employs at least two further insulation layers of glass fiber such that a first layer of glass fiber is laid upon a top surface of the potted circuit and tucks in and around the circuit board which is typically positioned along or proximal to a bottom surface of the housing. The first glass fiber layer can be affixed to the circuit on at least one edge by applying the glass fiber layer to the potted circuited while the potting material is still "wet" and not yet hardened. In a preferred embodiment, the first glass fiber layer is woven sheet of fiberglass. Further, wires from the potted circuit are pushed through the fiber glass weave and out through the opening in the housing, such that a portion of the fiberglass weave fills the housing opening.

A second glass fiber layer is then laid upon a top surface of first glass fiber layer such that the second glass fiber layer fills a majority of any resulting free space within the housing and up to a bottom surface of a top or lid portion, which seals the housing. In a preferred embodiment, the second glass fiber layer is a fiberglass padding (or "fluff") that is generally more pliable than the woven first fiberglass layer.

BRIEF DESCRIPTION OF THE DRAWINGS

The invention may be best understood by those having ordinary skill in the art by reference to the following detailed description when considered in conjunction with the accompanying drawings in which.

DETAILED DESCRIPTION OF THE INVENTION

Figure 1:
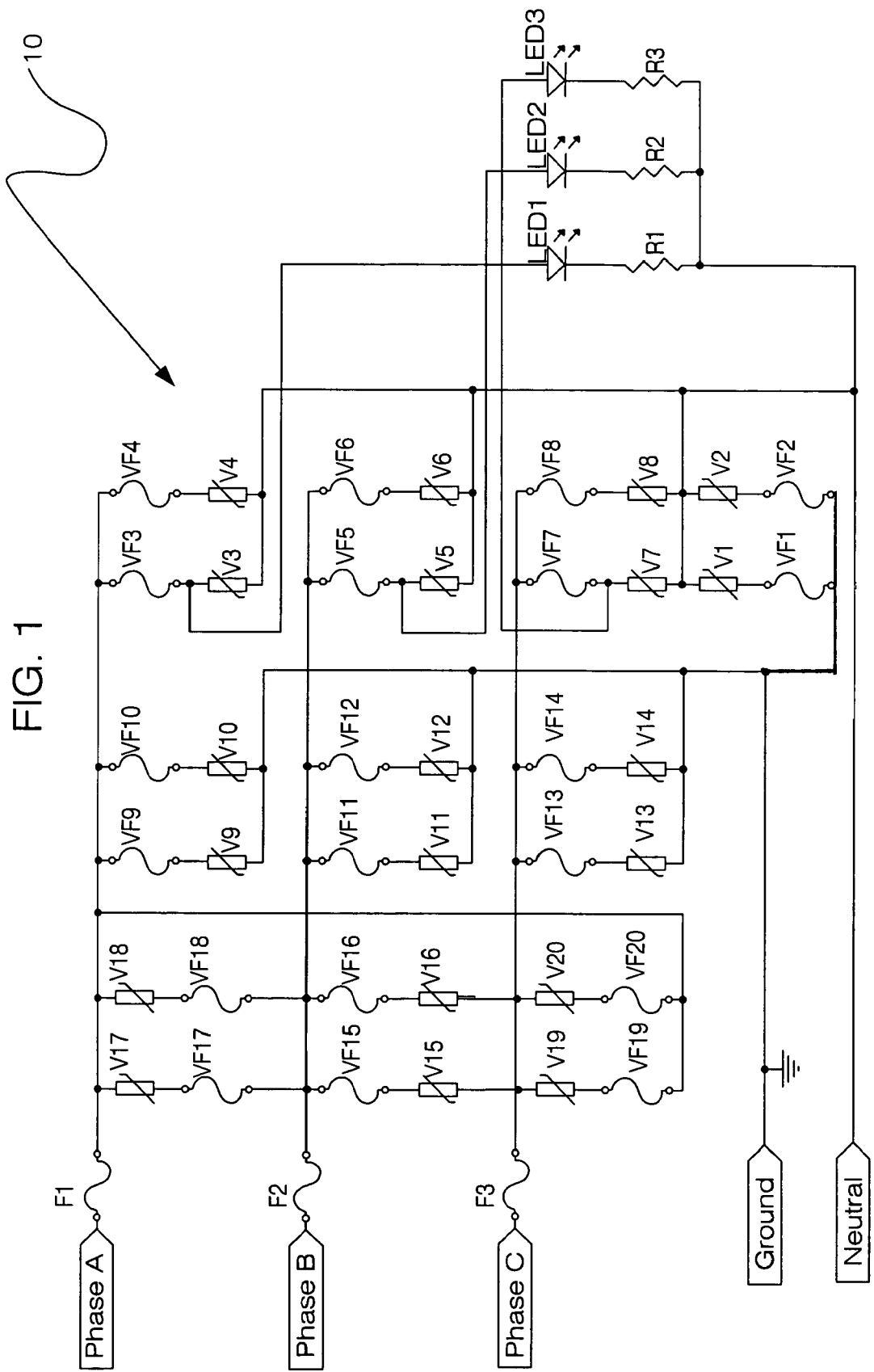
FIG. 1 is an electrical schematic diagram of a novel circuit used in the TVSS device of the present invention.

Throughout the following detailed description, the same reference numerals refer to the same elements in all figures.

Figure 2:
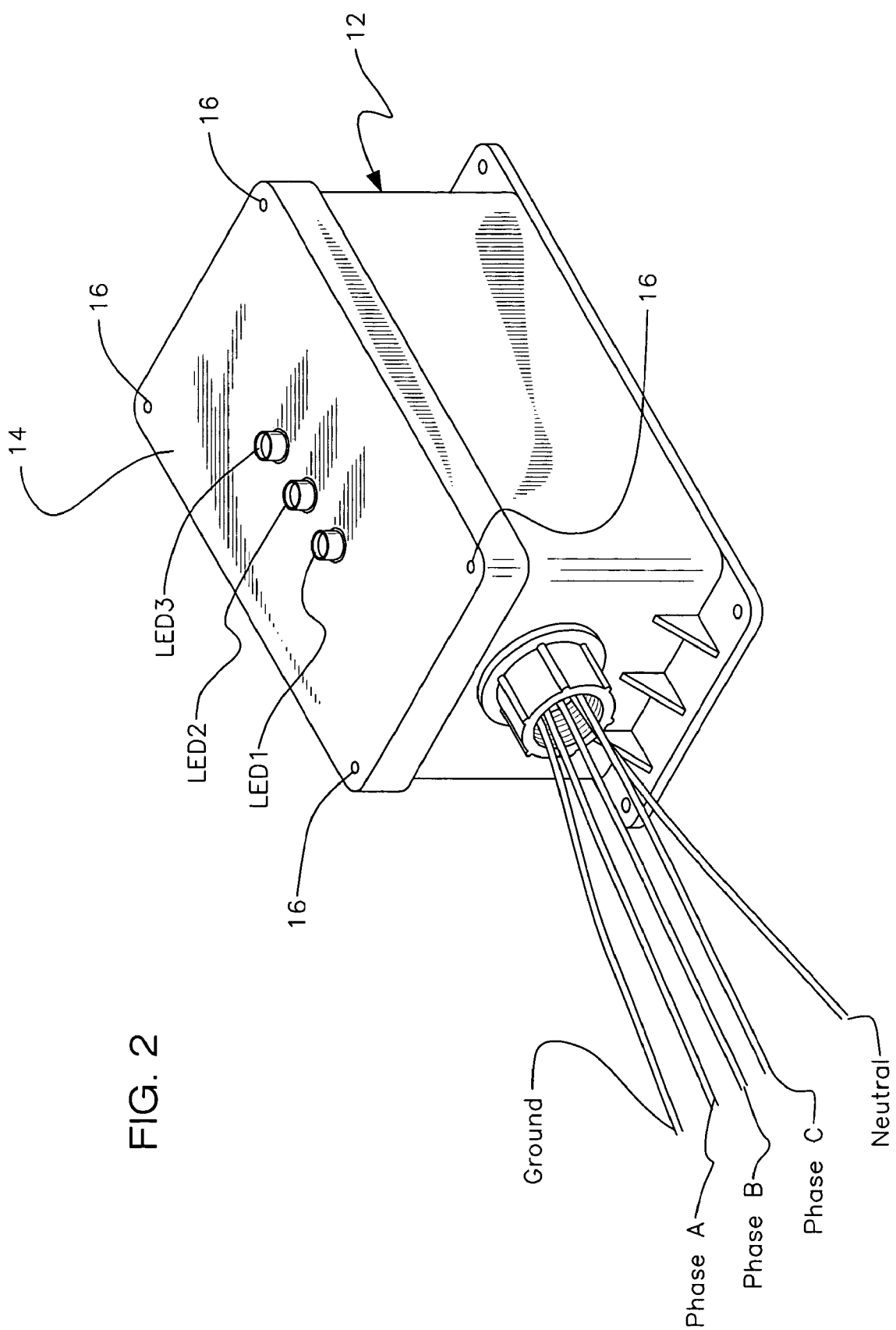
FIG. 2 is a perspective view of a housing enclosing the novel TVSS device circuit of the present invention.
Figure 3:
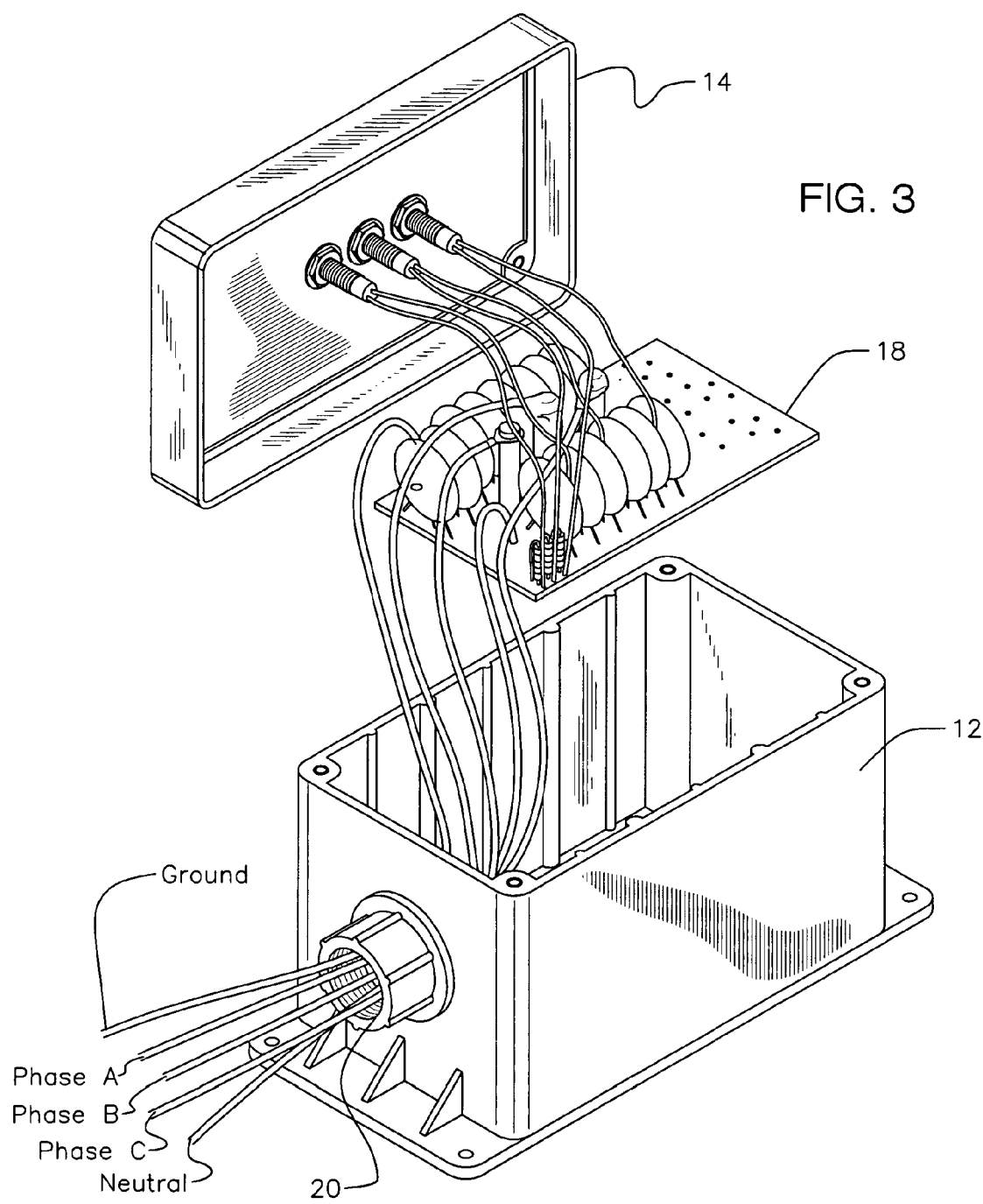
FIG. 3 is an exploded view of the housing enclosing the novel TVSS device circuit employing three fuses.

Referring to FIG. 1, an electrical schematic diagram is shown illustrating a fused transient surge suppression circuit 10 employed with a transient voltage surge suppression device of the present invention. As shown, circuit 10 employs a plurality of Metal Oxide Varistors (MOVs) V1-V20 arranged in three columns (one for each phase of a three phase line) but electrically coupled in parallel. It is understood that nothing herein limits the use of this novel circuit with either single or two phase lines. It is further understood that any number of MOVs or like surge suppression components can be employed per column. Also, the number of columns can vary dependent upon the modes of protection for the surge suppression application. FIGS. 1-3 illustrate a preferred embodiment wherein a three phase line is employed having Phase A, Phase B, Phase C, Neutral and Ground.

Each MOV V1-V20 has its own thermal fuse VF1-VF20, respectively, coupled in series with its MOV (herein jointly numbered 28). In the preferred embodiment, thermal fuses VF1-VF20 are enclosed within the component body of each MOV V1-V20, respectively. A set of three LEDs, LED1-3, one for each phase of the three phase line, are employed for indicating that a failure may have occurred with any one of the three columns of MOVs associated with a given phase of the three phase line. A set of three resistors, R1, R2 and R3, are also employed in series with LED1, LED2 and LED3, respectively.

With continuing reference to FIG. 1, it is shown that three surge rated fuses, F1, F2 and F3, collectively individually numbered 30) are employed wherein one fuse is provided for each phase of the three phase line. As shown, fuses F1, F2 and F3 are all coupled directly to the power terminals of the three phase electrical line and are also coupled directly, in very close proximity, to the array of MOVs. This provides for a very short lead length for fuses F1, F2 and F3. In the preferred embodiment, ferrule type surge rated fuses are employed, rated for 5-100 kA 8×20 uSec Waveforms, 600 VAC, 200 kA I.R. These fuses permit the TVSS device to withstand a rated surge pulse without opening, but are current limiting under AC short circuit conditions. Nothing herein limits this invention from using higher or lower rated fuses to accomplish the same result for a different application for TVSS technology.

The mounting of fuses F1, F2 and F3 (number 30 in FIGS. 3 and 5) on the same printed circuit board as the array of MOVs and their associated thermal fuses permit the TVSS device of the present invention to employ only one circuit board 18, which in turn permits a small housing to be used.

Referring to FIG. 2, a housing 12 is shown which encloses circuit 10. Housing 12 is made from a high fire retardant material to inhibit the spreading of a fire in the unlikely event of a melt down of the MOVs on circuit 10. Housing 12 includes a cover 14, on which are mounted the three LEDs, Led1, LED2 and LED3. Cover 14 is held in place by a set of screws 16 at each corner of cover 14.

Referring to FIG. 3, an exploded view of housing 12 is shown. As illustrated, circuit 10 is enclosed within housing 12 and mounted upon a single printed circuit board (PCB) 18. Each phase of a three phase line, Phase A, Phase B and Phase C, along with Neutral and Ground, couple to PCB 18 and has wire leads 34 and Neutral and Ground extending therefrom through an aperture 20 in housing 12.

Figure 4:
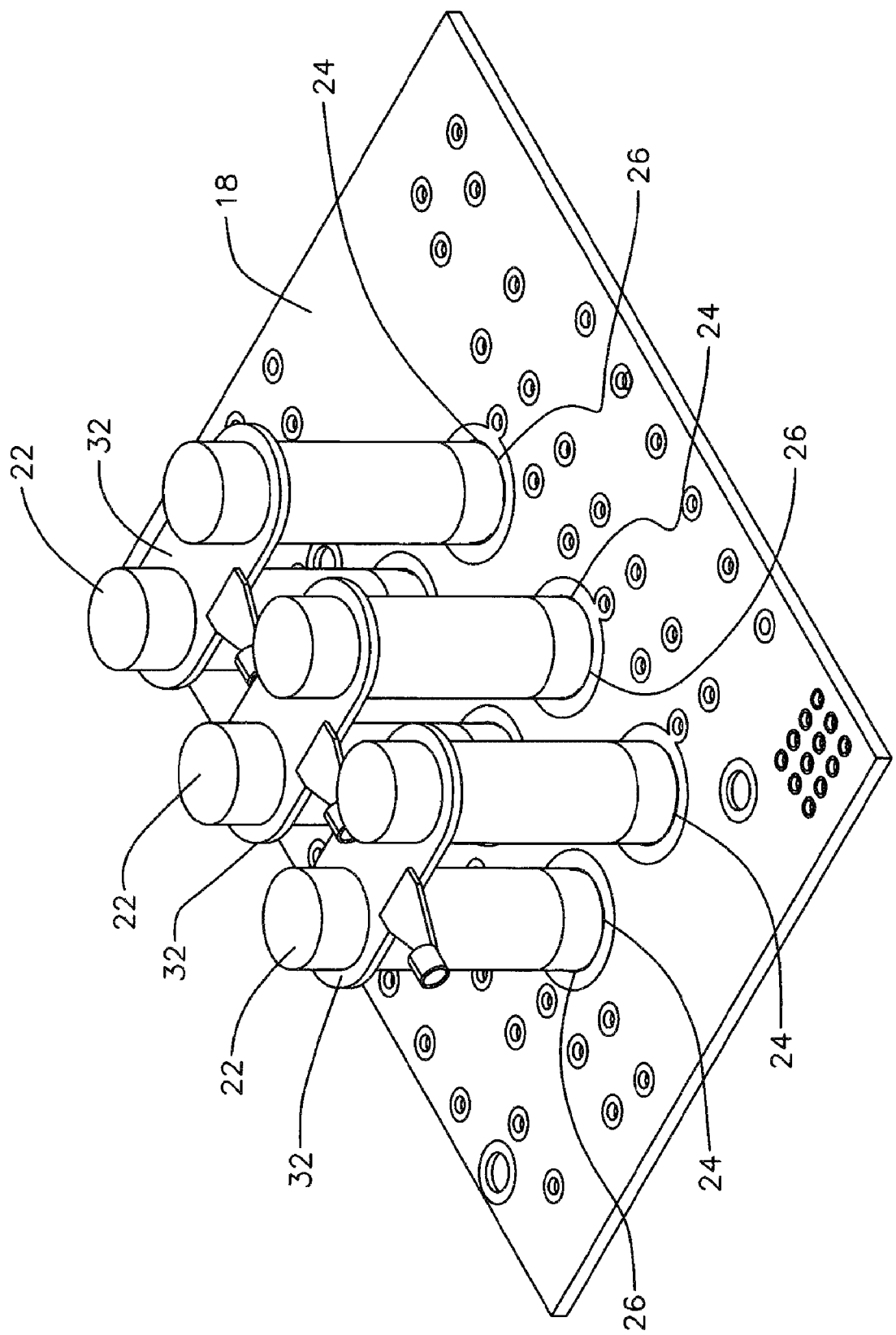
FIG. 4 is a perspective view of three pair of fuses soldered to a circuit board.

Referring to FIG. 4, pairs of ferrule type fuses 22 are soldered 24 to suitable size bores 26 in circuit board 18. Rows of varistors 28 (not shown in this FIG. 4) are mounted in each side of the fuses 22. A ring terminal 32 electrically connects the pair of ferrule type fuses 22. The ring terminal 32 can be a standard, flag or dual ring terminal as needed. Electrical conductors 34 connect the fuse to the electrical circuit to be protected such as phase A, B or C shown in FIGS. 1-3.

Figure 5:
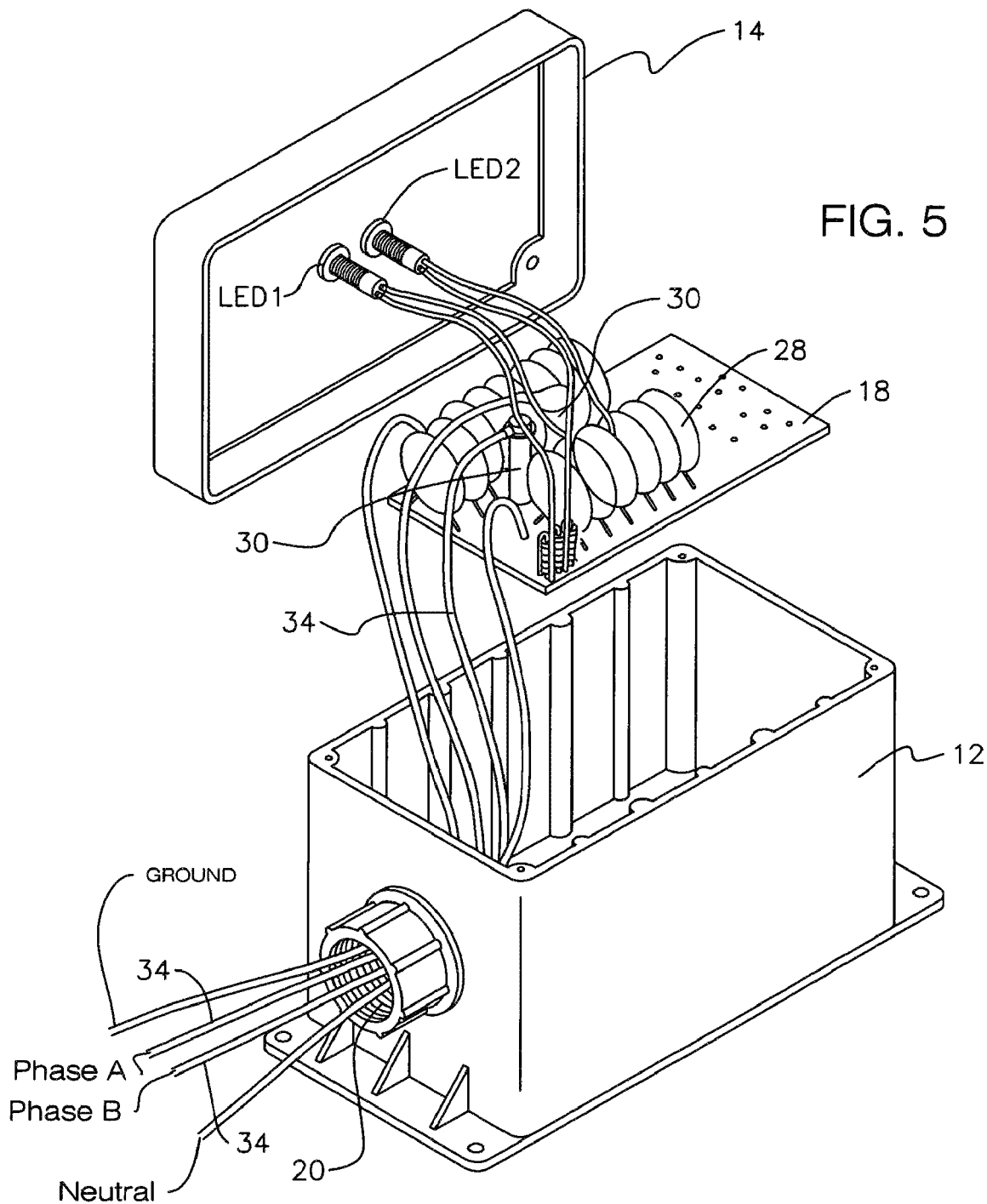
FIG. 5 is an exploded view of the housing enclosing the novel TVSS device circuit employing two fuses.

Referring to FIG. 5 as few as two fuses 30 are positioned between varistors 28. These fuses can be used for separate phases A and B or can be combined with a ring terminal 32 to protect a single circuit.

Another embodiment of the fusing system includes the connection of the ferrule fuse between two circuit boards with appropriately sized bores through them. The fuse or multiple fuses can be placed in between these boards and soldered into place. This will allow for the connection of multiple fuses from and to multiple phases, modes or suppression components. The fuses will be soldered into place on both of the boards.

Additional diagnostic circuits or features can be employed with the TVSS device of the present invention to achieve the same results in the same way and in the same manner.

Figure 6:
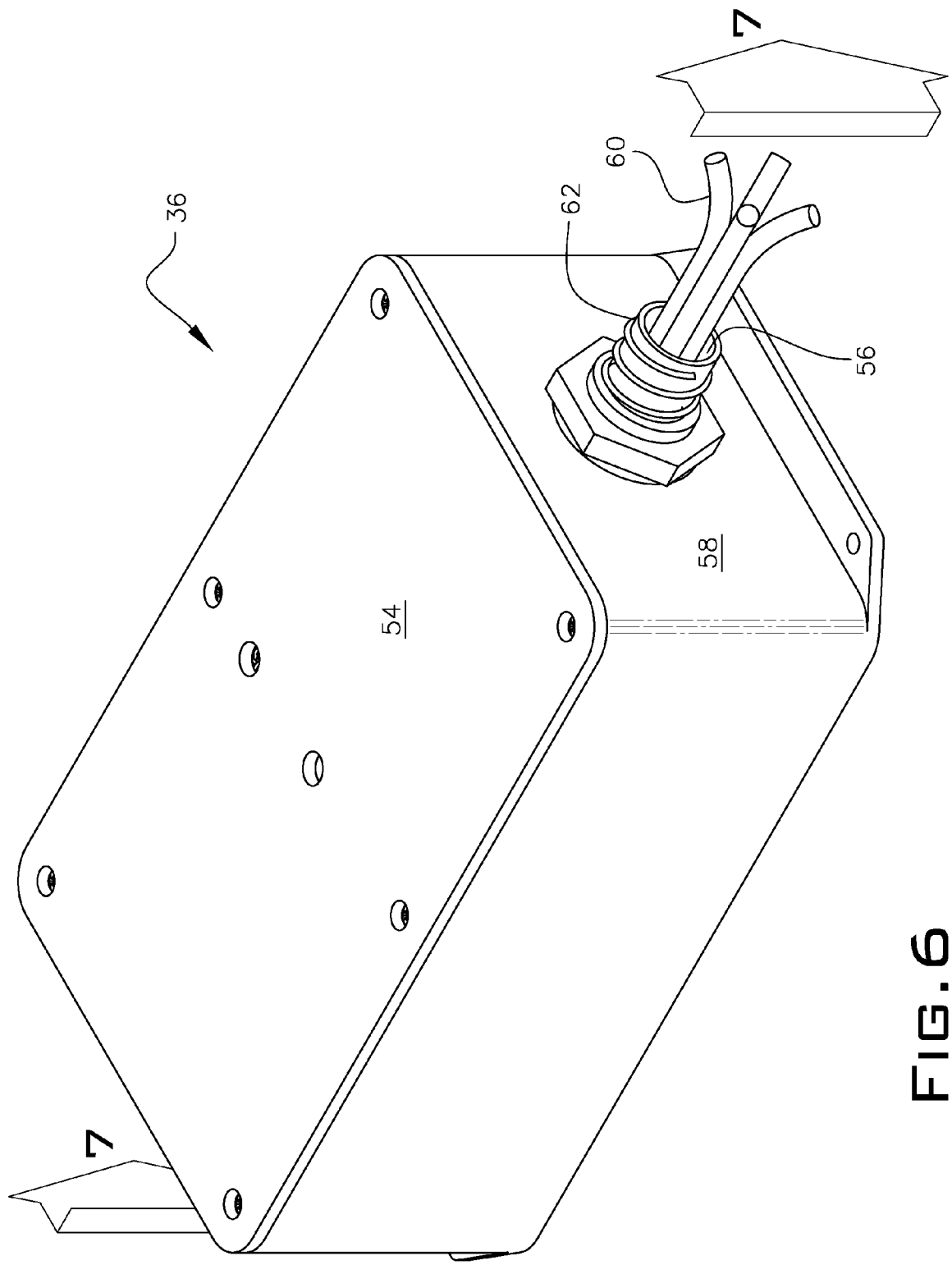
FIG. 6 is a perspective view of a preferred embodiment of the present invention.
Figure 7:
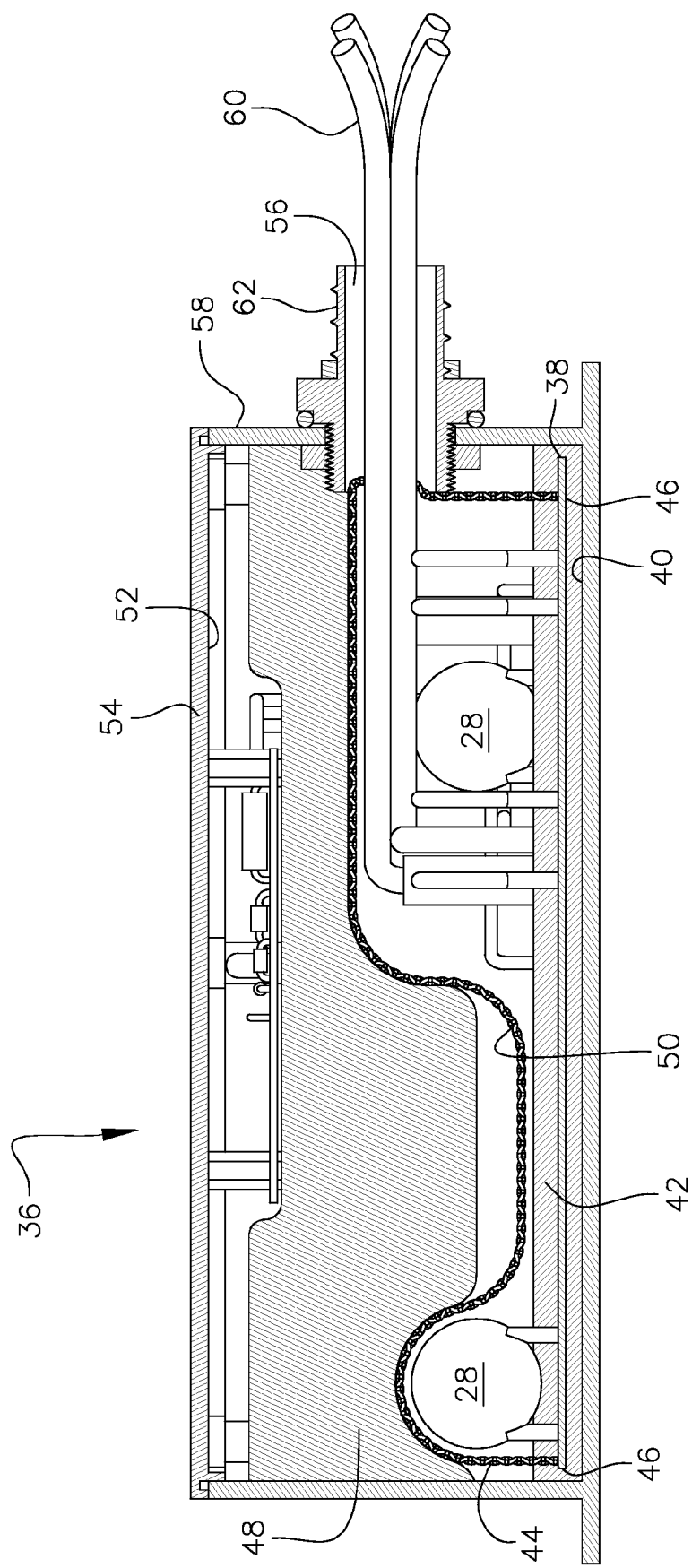
FIG. 7 is a cross-sectional view of the preferred embodiment of the present invention along lines 7-7 of FIG. 6, illustrating a potted circuit board with two layers of insulating material disposed within the housing.

Referring now to FIGS. 6 and 7, a preferred embodiment of the present novel insulation system for electrical circuits is shown. A housing 36, generally of a rectangular shape, although other shaped housings can be employed, is shown for the preferred embodiment. As shown in the cross-sectional view of FIG. 7, housing 36 encloses an electrical circuit board 38 positioned near or along an inner bottom surface 40 of housing 36. Electrical circuit board 38 is potted (encapsulated by a thermosetting compound) with potting material 42, which is poured wet over electrical circuit board 38 and allowed to harden. A first layer of glass fiber 44 is draped over (i.e., laid upon) a top surface of electrical circuit board 38 at a time when the potting material 42 has just been poured and is therefore still wet (i.e., not yet harden), such that a peripheral edge 46 of the first layer of glass fiber 44 can be tucked in and around circuit board 38 and be allowed to adhere to the potting material 42 as it hardens. In this configuration, first layer of glass fiber 44 acts like a blanket covering circuit board 38. Thereafter, a second layer of glass fiber 48 is placed upon a top surface 50 of first layer of glass fiber 44 and generally fills the remaining air spaces within housing 36 up and to a bottom surface 52 of a lid portion 54 of housing 36.

Figure 8:
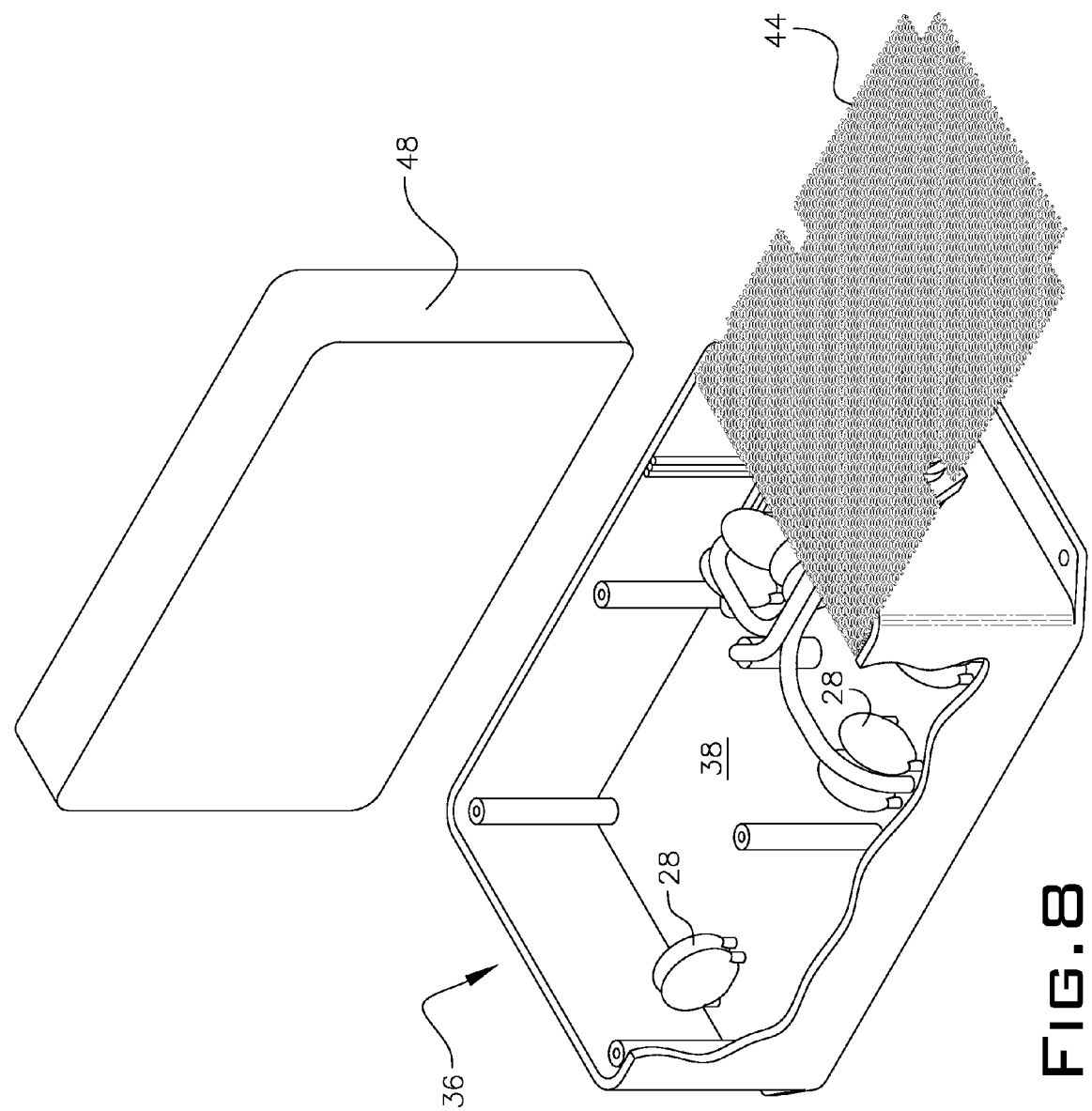
FIG. 8 is a partially exploded view of the preferred embodiment of the present invention illustrating the two layers of insulating material of the present invention.

Referring to FIG. 8, is shown that in a preferred embodiment, first layer of glass fiber 44 is a woven sheet of fiberglass, while second layer of glass fiber 48 is fiberglass padding. For the purposes of FIG. 8, a partially exploded view, lid portion 54 of housing 36 is not shown as well as potting material 42.

Figure 9:
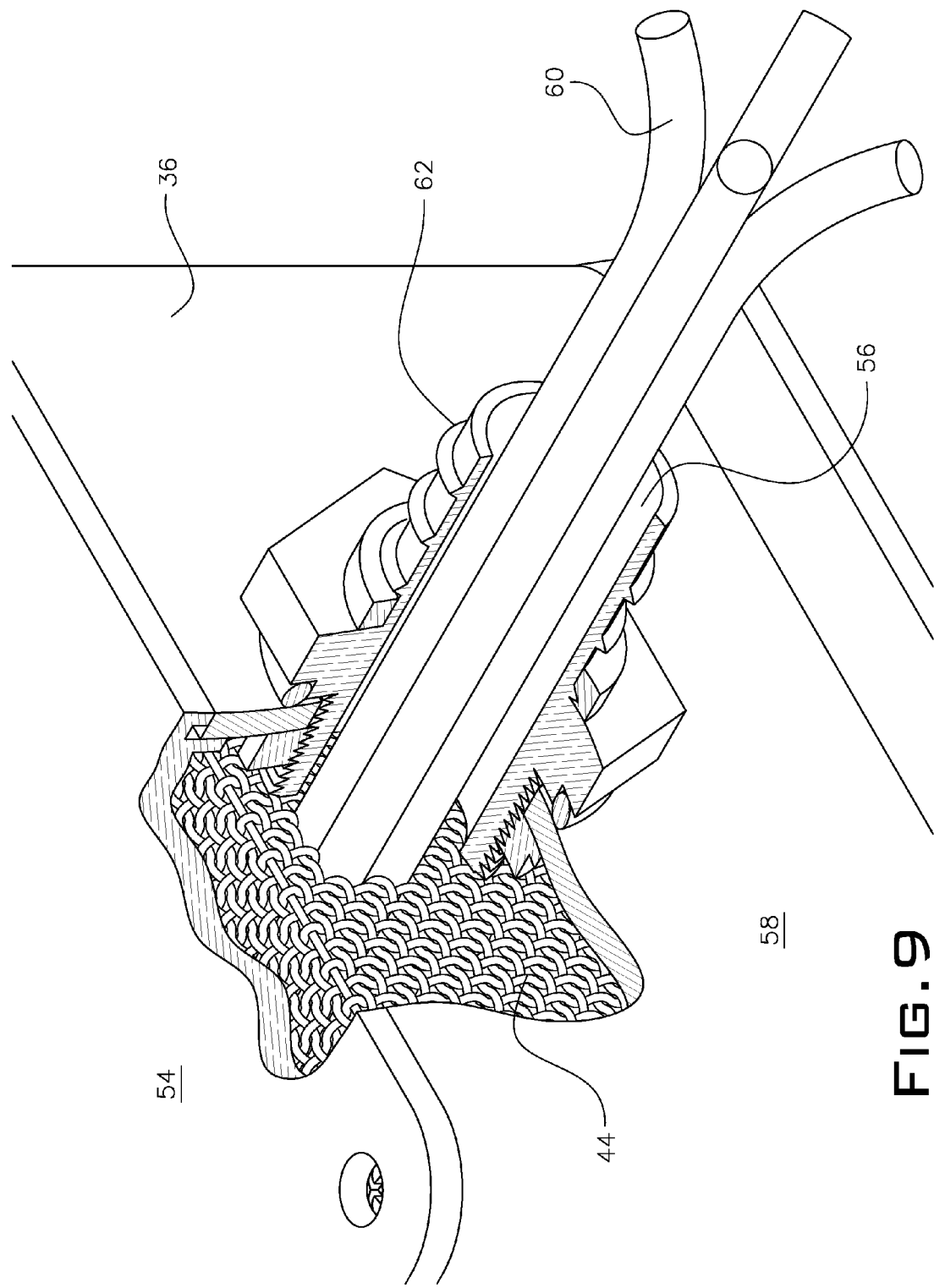
FIG. 9 is a detail view, partially cut-away, of an aperture formed in a side wall of the housing, illustrating that wires of the circuit penetrate one of the layers of insulating material, which in turn fills a portion of an opening in the aperture.

Further to FIG. 7, and with reference to FIG. 9 as well, a set of wires 60, in communication with circuit board 38, protrude through an opening (or aperture) 56 formed in a side wall 58 of housing 36 for connection to other electrical equipment (not shown). As shown in FIGS. 6 7, and 9, opening 56 has a threaded fitting 62 inserted therein. Further, as seen in FIGS. 7 and 9, set of wires 60, insert or punch through the fiberglass weave of first layer of glass fiber 44 such that a small portion of the fiberglass weave is tucked within opening 56 and thereby partially filling it and separating the inside area of housing 36 from the outside ambient air around housing 36. A threaded fitting is used so that a locking nut can be threaded onto the housing and used as a strain relief.

Figure 10:
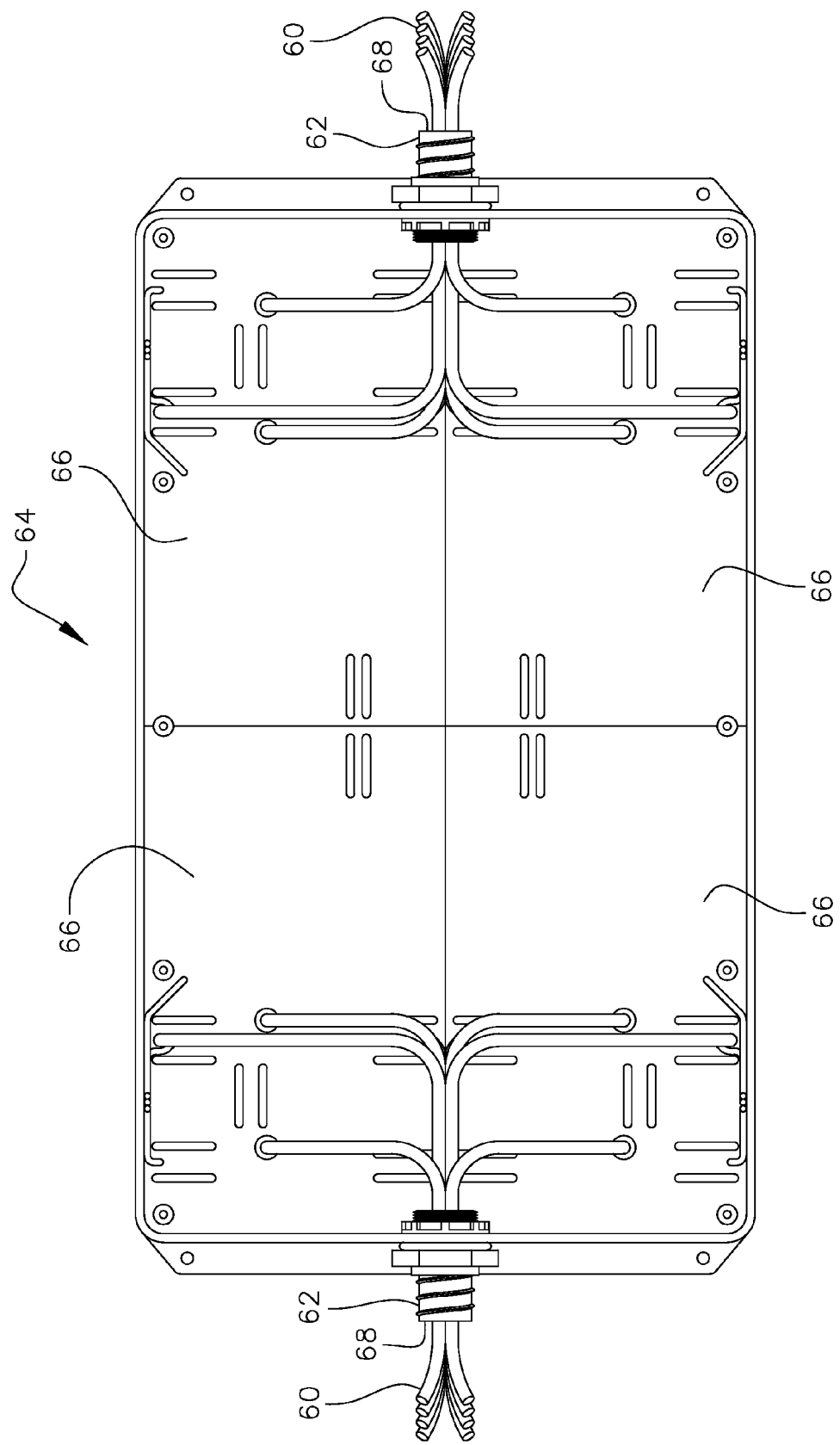
FIG. 10 is a top plan view of an alternate embodiment of the TVSS device of the present invention illustrating that multiple modular boards can be employed side by side within a single housing.

Referring now to FIG. 10, a first alternate embodiment of the present invention is shown, wherein a housing 64 is shaped such that it can receive and retain a plurality of electrical circuit board modules 66. In the alternate embodiment of FIG. 10, four modules 66 are employed and are positioned side by side to fill the bottom surface of housing 64. It is understood, although not shown, that the first and second layers of glass fiber, 44 and 48 respectively, would then be employed as described in the preferred embodiment above. Further to FIG. 10, a pair of openings 68 is employed and can be formed in opposing side walls 70 as shown therein, although nothing herein limits different configurations for openings 68 and for openings 68 being formed in different side walls, or formed in the same side wall, or using more or less than two openings. The sets of wires 60, as in the preferred embodiment, protrude through openings 68.

Figure 11:
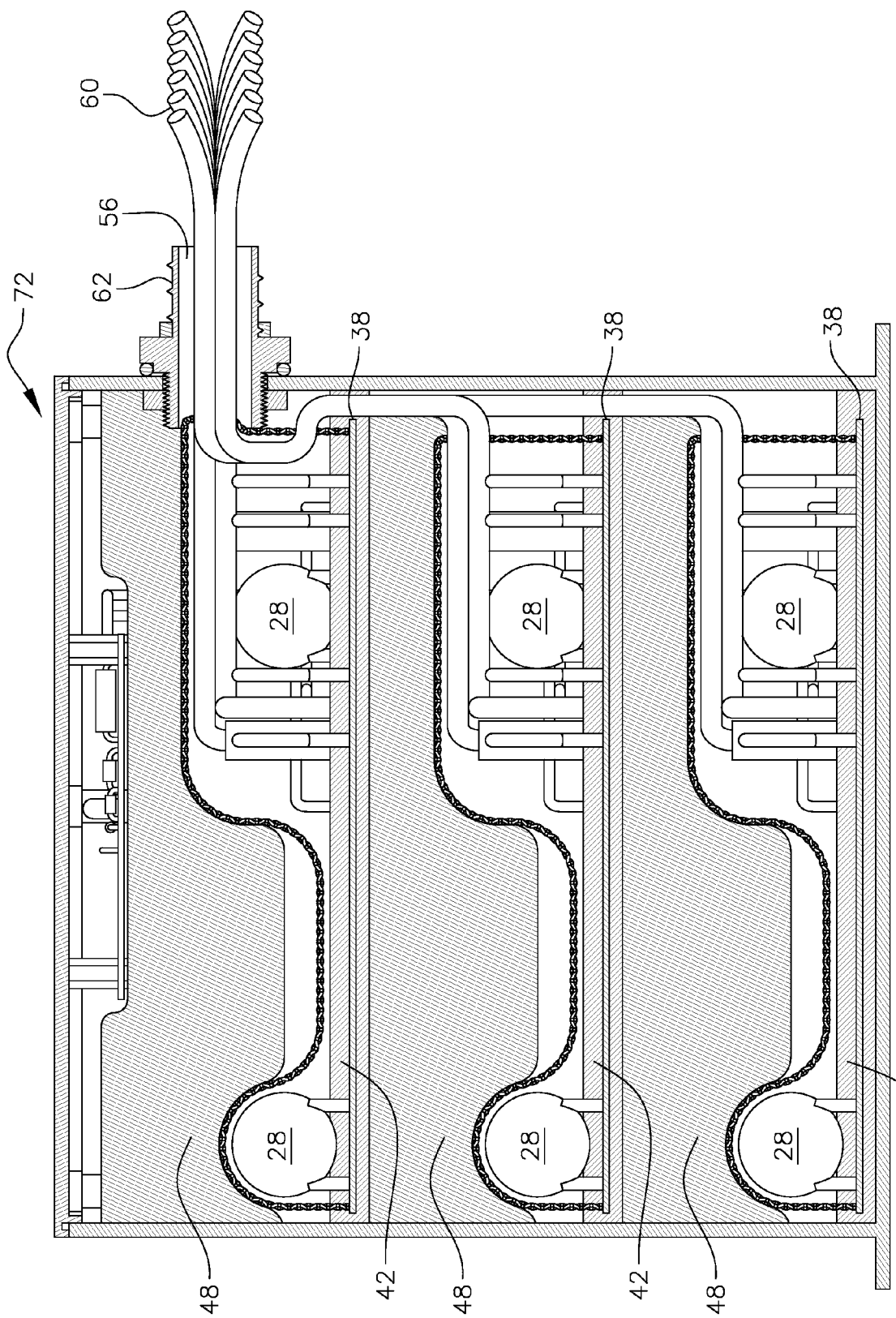
FIG. 11 a cross-sectional view of an alternate housing of another alternate embodiment of the TVSS device of the present invention utilizing the novel insulating layers of said present invention.

In a second alternate embodiment, a "tall" housing 72 is employed, as shown in FIG. 11. In such embodiment, a series, for example three, of electrical circuit boards 38 is employed within tall housing 72 and are stacked one on top of the other. All boards 38 are potted with a potting material 42 and each board has its own first and second layer of glass fiber, 44 and 48 respectively, as described above in the preferred embodiment. Depending on the number of boards 38 employed would dictate how many openings 56 are employed. In FIG. 11, one opening 56 is formed in a side wall of housing 72. However, nothing herein limits the number of openings 56 that can be formed therein for permitting the sets of wires 60 to protrude therefrom.

Figure 12:
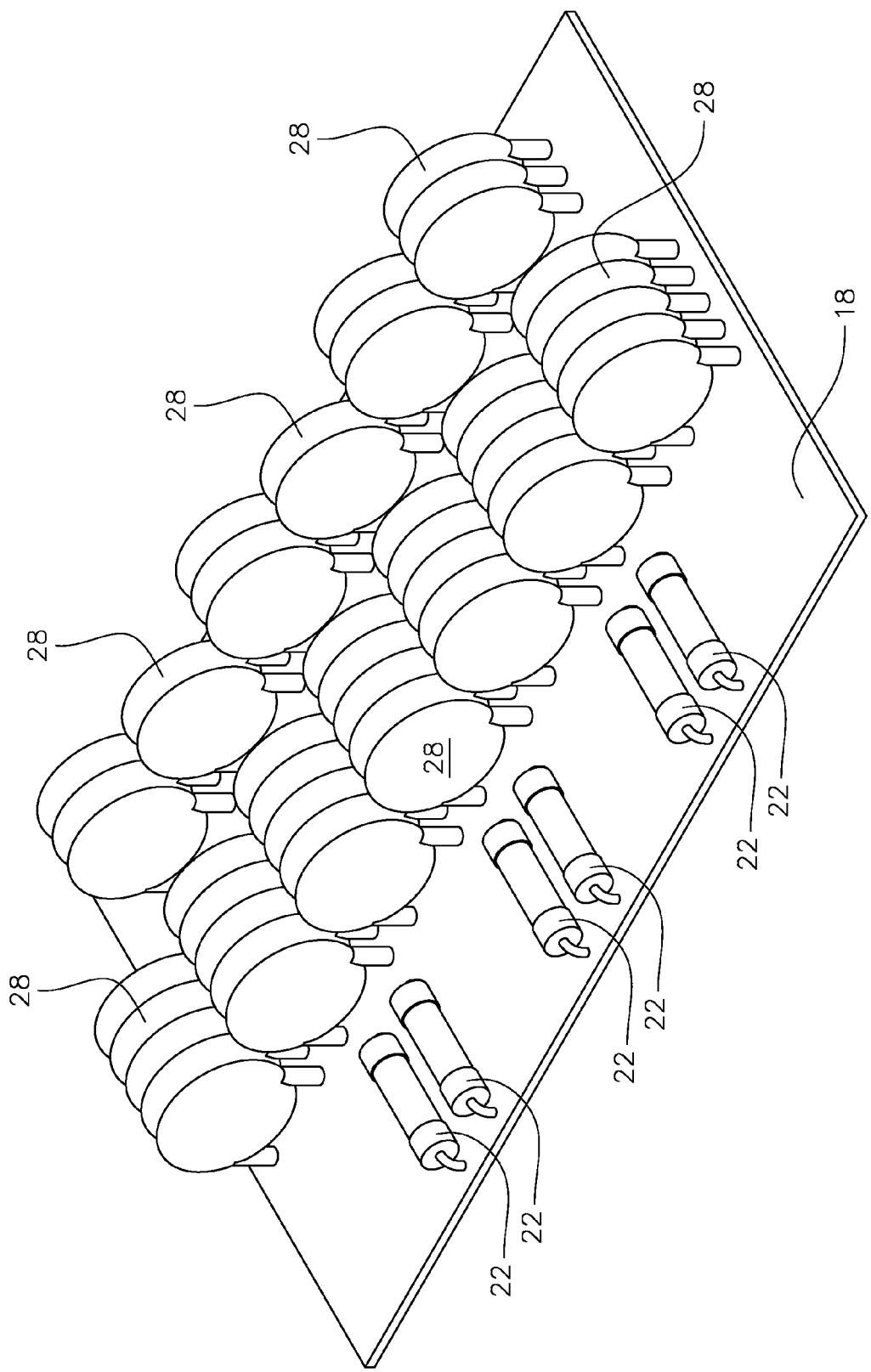
FIG. 12 is a perspective view of an alternate configuration of a printed circuit board employed with the TVSS device of the present invention.

Referring to FIG. 12, an alternate embodiment to that which is shown in FIG. 4 is shown, wherein the pairs of ferrule type fuses 22 are soldered 24 to suitable size bores 26 in circuit board 18, but orientated along a horizontal plane instead of uprights as that shown in FIG. 4. Rows of varistors 28 are mounted thereon Equivalent elements can be substituted for the ones set forth above such that they perform the same function in the same way for achieving the same result.

Having thus described the invention what is claimed and desired to be secured by Letters Patent is:

1. An enclosed and insulated electrical circuit for preventing component product residue from damaging or injuring other proximal components or circuits as a result of circuitry failure, the enclosed and insulated electrical circuit comprising:
    a) a housing for enclosing at least one electrical circuit, the housing having at least one opening formed therein and a top portion for sealing the housing,
    b) a potting material applied to and hardened around the at least one electrical circuit,
    c) the at least one electrical circuit with the potting material applied thereto positioned proximal to an inside bottom surface of the housing,
    d) an at least one first layer of glass fiber laid upon a top surface of the at least one electrical circuit with the potting material applied thereto and further tucked in and around the at least one electrical circuit, a set of connection wires of the at least one electrical circuit pushed through the at least one first layer of glass fiber and out through the opening of the housing, and
    e) an at least one second layer of glass fiber laid upon a top surface of the at least one first layer of glass fiber such that a majority of any remaining free space within the housing is filled up to a bottom surface of the top portion of the housing when sealed.

2. The enclosed and insulated electrical circuit according to claim 1, wherein the housing encloses one potted electrical circuit board.

3. The enclosed and insulated electrical circuit according to claim 1, wherein the housing encloses two or more potted electrical circuit boards employed as modules and positioned along a common horizontal plane within the housing.

4. The enclosed and insulated electrical circuit according to claim 1, wherein the housing encloses two or more potted electrical circuit boards employed as modules and positioned along a vertical plane such that one is positioned on top of the other.

5. The enclosed and insulated electrical circuit according to claim 4, wherein an at least one first layer of glass fiber and an at least one second layer of glass fiber is positioned on top of each of the two or more potted electrical circuits positioned along the vertical plane.

6. The enclosed and insulated electrical circuit according to claim 1, wherein the at least one second layer of glass fiber is a padded fiberglass layer.

7. The enclosed and insulated electrical circuit according to claim 1, wherein the electrical circuit is a surge suppression circuit.

8. An enclosed and insulated apparatus for preventing damage or injury to proximal electrical components or circuits due to electronic circuitry failure within said apparatus, the enclosed and insulated apparatus comprising:
    a) a housing forming the apparatus and enclosing at least two electrical circuits, the housing having at least one opening formed therein and a top portion for sealing the housing,
    b) a potting material applied to and hardened around the at least two electrical circuits, c) the at least two electrical circuits with the potting material applied thereto positioned proximal to an inside bottom surface of the housing,
d) an at least one first layer of glass fiber laid upon a top surface of a top electrical circuit of the at least two electrical circuits with the potting material applied thereto, a set of connection wires of the at least two electrical circuits pushed through the at least one first layer of glass fiber and out through the opening of the housing, and
e) an at least one second layer of glass fiber laid upon a top surface of the at least one first layer of glass fiber such that a majority of any remaining free space within the housing is filled up to a bottom surface of the top portion of the housing when sealed.

9. The enclosed and insulated apparatus of claim 8, wherein two potted electrical circuits are employed.

10. The enclosed and insulated apparatus of claim 9, wherein at least one of the two potted electrical circuits is a surge suppression circuit.

11. The enclosed and insulated apparatus of claim 10, wherein the surge suppression circuit comprises:
   a) a printed circuit board mounted within the housing, the circuit board having multiple through bores of varying diameters for receipt of electrical components;
   c) a first and second row of metal oxide varistors soldered to the circuit board in bores of suitable diameter;
   d) at least one surge rated ferrule type fuses having an outer metal electrically conductive surface soldered directly to the circuit board in a bore of suitable diameter between the first and second row of varistors; and
   e) the set of connection wires connecting the ferrule type fuse to an electrical circuit to be protected by said surge suppression circuit.

12. The enclosed and insulated apparatus of claim 8, wherein the at least one second layer of glass fiber is a padded fiberglass layer.

* * * * *